United States Patent
Sun et al.

(10) Patent No.: US 10,176,289 B2
(45) Date of Patent: Jan. 8, 2019

(54) METHOD FOR DECOMPOSING SEMICONDUCTOR LAYOUT PATTERN

(71) Applicant: UNITED MICROELECTRONICS CORP., Hsin-Chu (TW)

(72) Inventors: Chia-Chen Sun, Kaohsiung (TW); Yu-Cheng Tung, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 38 days.

(21) Appl. No.: 15/462,900

(22) Filed: Mar. 19, 2017

(65) Prior Publication Data

US 2018/0247005 A1 Aug. 30, 2018

(30) Foreign Application Priority Data

Feb. 24, 2017 (TW) .............................. 106106338 A

(51) Int. Cl.
*G06F 17/50* (2006.01)

(52) U.S. Cl.
CPC ................................ *G06F 17/5072* (2013.01)

(58) Field of Classification Search
CPC .................................................. G06F 17/5072
USPC ............................................................ 716/55
See application file for complete search history.

(56) References Cited

U.S. PATENT DOCUMENTS

| | | | |
|---|---|---|---|
| 5,759,744 A | 6/1998 | Brueck et al. | |
| 6,498,105 B1 | 12/2002 | Kim | |
| 6,664,028 B2 | 12/2003 | Hwang et al. | |
| 7,005,235 B2 | 2/2006 | Lin | |
| 7,632,610 B2 | 12/2009 | Wallace et al. | |
| 8,111,921 B2 | 2/2012 | Hsu et al. | |
| 8,222,152 B2 | 7/2012 | Sun | |
| 8,601,403 B2 | 12/2013 | Tang | |
| 8,921,016 B1 * | 12/2014 | Kallingal | G03F 1/70 430/30 |
| 2004/0005089 A1 * | 1/2004 | Robles | G03F 1/36 382/141 |
| 2006/0200790 A1 * | 9/2006 | Shang | G03F 1/36 430/5 |
| 2008/0301620 A1 * | 12/2008 | Ye | G03F 1/36 716/50 |
| 2013/0086542 A1 * | 4/2013 | Teoh | G06F 17/5031 716/113 |

(Continued)

*Primary Examiner* — Suresh Memula
(74) *Attorney, Agent, or Firm* — Winston Hsu

(57) ABSTRACT

A method for a semiconductor layout pattern decomposition includes following steps. (a) receiving a semiconductor layout pattern; (b) performing a first separation/decomposition to the semiconductor layout pattern to obtain a grille pattern and a non-grille pattern; (c) recognizing a plurality of intersection regions in the grille pattern and alternately marking the intersection regions with a first region and a second region; (d) performing a second separation/decomposition to the grille pattern to obtain a plurality of first sub-patterns and a plurality of second sub-patterns perpendicular to each other, the first sub-patterns including the first regions, the second sub-patterns including the second regions; and (e) introducing a plurality of first assistance features on the first regions in the first sub-patterns and on the second regions on the second regions in the second sub-patterns, respectively. The step (a) to the step (e) are implemented using a computer.

19 Claims, 12 Drawing Sheets

(56) References Cited

U.S. PATENT DOCUMENTS

| | | | |
|---|---|---|---|
| 2013/0149636 A1* | 6/2013 | Gyoda | G03F 1/70 430/5 |
| 2016/0162623 A1* | 6/2016 | Lutich | G03F 1/36 716/51 |
| 2016/0239591 A1* | 8/2016 | Sampath | G01V 99/005 |
| 2016/0267210 A1* | 9/2016 | Kang | G06F 17/5072 |

* cited by examiner

METHOD FOR DECOMPOSING SEMICONDUCTOR LAYOUT PATTERN

BACKGROUND OF THE INVENTION

1. Field of the Invention

The present invention relates to a method for decomposing a semiconductor layout pattern, and more particularly, to a method for decomposing a semiconductor layout pattern for multiple patterning technique.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For these purposes, in conventional semiconductor techniques, a mask layer is formed on the material substrate/layers, and these tiny elements are defined in the mask layer and followed by being transferred to the objective material substrate/layers. Generally, the mask layer may include or is formed by means of a layer of photoresist that is patterned by lithographic process and/or patterned hard mask including the patterns transferred from the patterned photoresist. Since the dimensions of the patterns in sophisticated ICs are steadily decreasing, the equipment used for patterning devices features have to meet very stringent requirements with regard to resolution and overlay accuracy of the involved fabrication processes. In this respect, resolution is taken as a measure specifying the consistent ability to print minimum images under conditions of predefined manufacturing variations.

However, as feature sizes are decreased under 85 nanometers (nm), the existing single patterning process has met its bottleneck to successfully render the features. In order to push the lithographic limit further and to create even smaller, more densely packed devices, multiple patterning technology such as double patterning process, are being developed with presently available manufacturing equipment. Typically, the multiple patterning technologies are to decompose dense layout patterns into sub-patterns and then use two or more masks to print each sub-pattern. By transferring the sub-patterns to the photoresist layer/mask layer, the wanted patterns are re-constructed and obtained.

It is found that the multiple patterning technology gives rise to process control challenges, however process complexity and process cost are unavoidably increased with the involvement of the multiple patterning technology.

SUMMARY OF THE INVENTION

According to an aspect of the present invention, a method for decomposing a semiconductor layout pattern is provided. The method include steps of: (a) receiving a semiconductor layout pattern; (b) performing a first separation/decomposition to the semiconductor layout pattern to obtain a grille pattern and a non-grille pattern; (c) recognizing a plurality of intersection regions in the grille pattern and alternately marking the intersection regions with a first region and a second region; (d) performing a second separation/decomposition to the grille pattern to obtain a plurality of first sub-patterns extended along a first direction and a plurality of second sub-patterns extended along a second direction, the first sub-patterns including the first regions, the second sub-patterns including the second regions, and the first direction and the second direction being perpendicular to each other; and (e) introducing a plurality of first assistance features on the first regions in the first sub-patterns and on the second regions in the second sub-patterns, respectively. Step (a)-(e) are implemented using a computer.

According to an aspect of the present invention, another method for decomposing a semiconductor layout pattern is provided. The method include following steps: (a) receiving a semiconductor layout pattern; (b) performing a first separation/decomposition to the semiconductor layout pattern to obtain a grille pattern and a non-grille pattern; and (c) introducing a plurality of first assistance features on the non-grille pattern. Step (a)-(c) are implemented using a computer.

According to the methods for decomposing the semiconductor layout pattern provided by the present invention, different assistance features are introduced in the different patterns. Accordingly, by separating the semiconductor layout pattern to the grille pattern and the non-grille pattern, and by introducing different assistance features in the grille pattern and the non-grille pattern, features/patterns formed on any single mask can be successfully and precisely formed by the multiple patterning lithography. Thus, the methods for decomposing the semiconductor layout pattern provided by the present invention improve the multiple patterning lithography result.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating the method for decomposing the semiconductor layout pattern provided by the preferred embodiment, wherein FIG. 3 is a schematic drawing in a step subsequent to FIG. 2;

FIG. 4 is a schematic drawing in a step subsequent to FIG. 3;

FIG. 5 is a schematic drawing in a step subsequent to FIG. 4;

FIG. 6 is a schematic drawing in a step subsequent to FIG. 5;

FIG. 7 is a schematic drawing in a step subsequent to FIG. 3; and

FIG. 8 is a schematic drawing in a step subsequent to FIG. 7.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
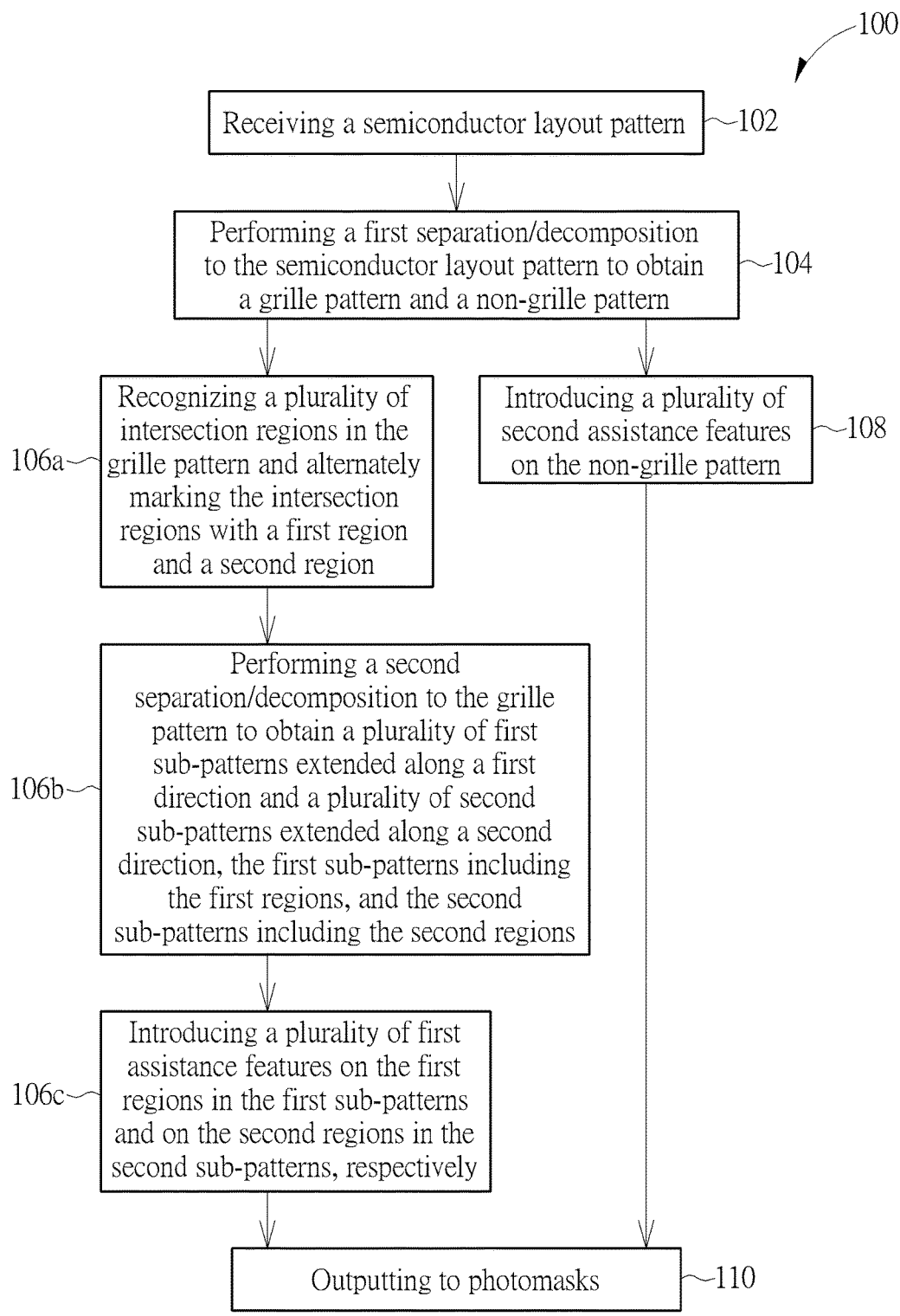
FIG. 1 is a flow chart of a method for decomposing a semiconductor layout pattern provided by a preferred embodiment of the present invention.

Please refer to FIGS. 1-8, FIG. 1 is a flow chart of a method for decomposing a semiconductor layout pattern provided by a preferred embodiment of the present invention, and FIGS. 2-8 are schematic drawings illustrating the method for decomposing the semiconductor layout pattern provided by the preferred embodiment. As shown in FIG. 1, the method for decomposing the semiconductor layout pattern 100 includes:

STEP 102: Receiving a semiconductor layout pattern

Figure 2:
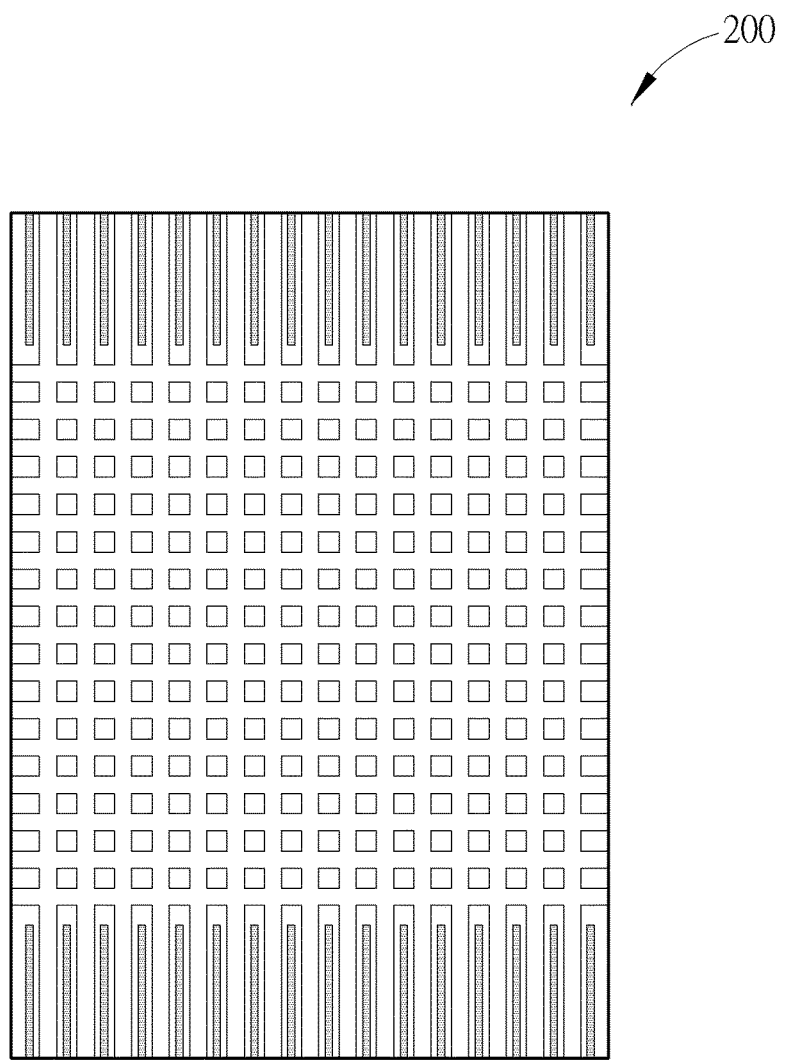

Please refer to FIG. 2 together with FIG. 1. As shown in FIG. 2, the preferred embodiment receives a semiconductor layout pattern 200, and the semiconductor layout pattern 200 includes a circuit layout pattern that can be formed in any objective layer for constructing the ICs. For example, the semiconductor layout pattern 200 can be a back-end-of-line (BEOL) layout pattern such as an interconnection layout pattern, or the semiconductor layout pattern 200 can be a front-end-of-line (FEOL) layout pattern such as device pattern. Furthermore, specific examples of arrangements and sizes of the features in the semiconductor layout pattern 200 as shown in FIGS. 2-8 are provided to simplify the present invention. These are merely examples and are not intended to be limiting.

Figure 3:
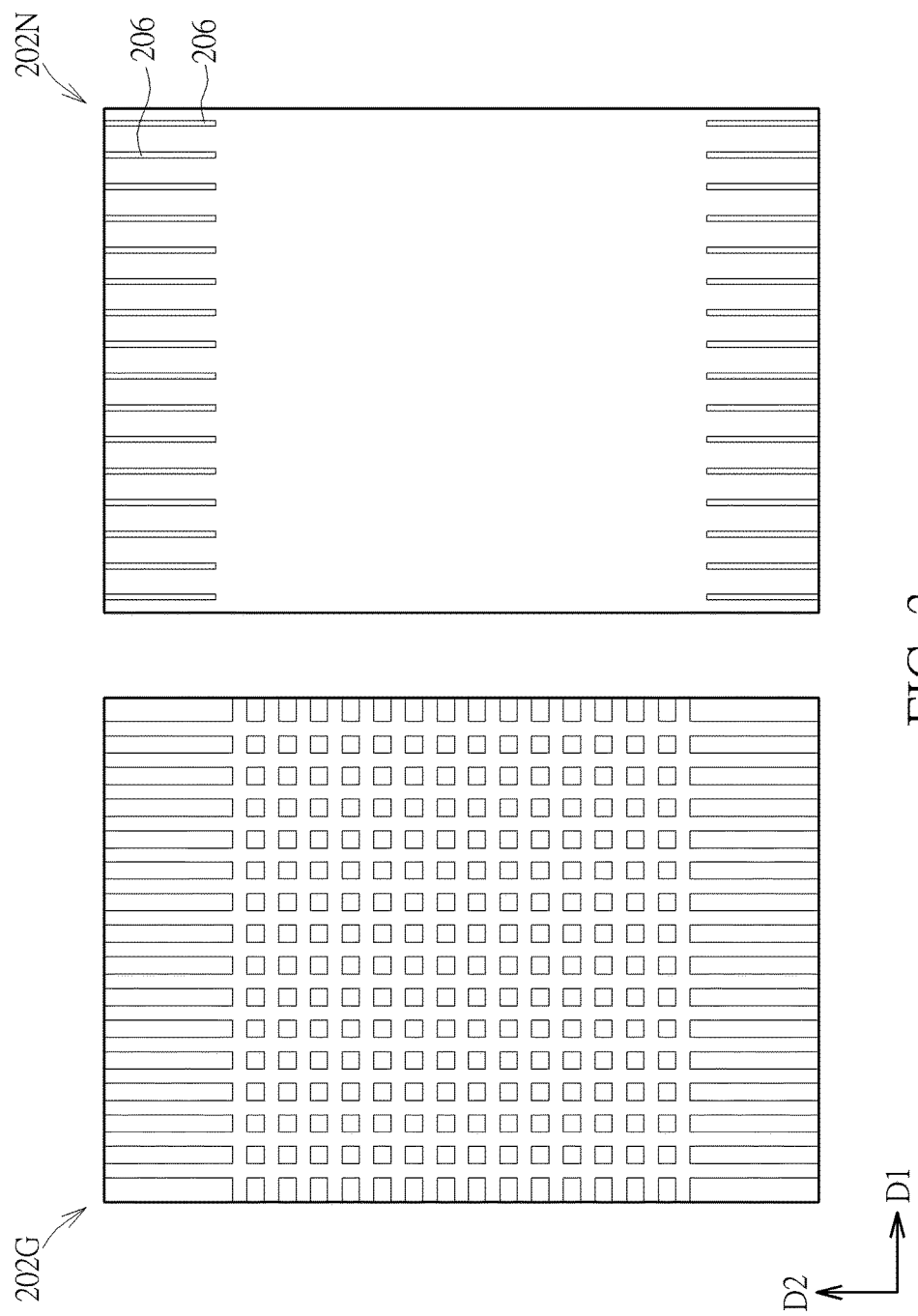

The method for decomposing the semiconductor layout pattern 100 provided by the preferred embodiment further includes:

STEP 104: Performing a first separation/decomposition to the semiconductor layout pattern to obtain a grille pattern and a non-grille pattern Please refer to FIG. 3 together with FIG. 1. As shown in FIG. 3, the first separation/decomposition is performed to the semiconductor layout pattern 200. In detail, when features of the semiconductor layout pattern 200 are extended along both a first direction D1 and a second direction D2, and the features include intersection regions, those features are defined as a grille pattern 202G. As shown in FIG. 3, the first direction D1 and the second direction D2 are perpendicular to each other. Furthermore, when features of the semiconductor layout pattern 200 are extended along only one direction, such as the second direction D2, and arranged along another direction, such as the first direction D1, those features are defined as a non-grille pattern 202N. After recognizing the grille pattern 202G and the non-grille pattern 202N, the grille pattern 202G and the non-grille pattern 202N are separated/decomposed according to the present invention.

Figure 4:
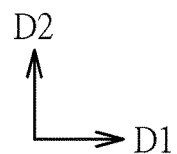

Next, steps are performed to the grille pattern 202G and the non-grille pattern 202N, respectively. Please refer to FIG. 1, the method for decomposing the semiconductor layout pattern 100 includes a STEP 106a:

STEP 106a: Recognizing a plurality of intersection regions in the grille pattern and alternately marking the intersection regions with a first region and a second region Please refer to FIG. 4 together with FIG. 1. As mentioned above, the grille pattern 202G includes a plurality of features extended along both the first direction D1 and the second direction D2, and those features intersect each other. Accordingly, the present invention is to recognize those intersection regions in the grille pattern 202G. More important, the present invention is to alternately mark the intersection regions with a first region "0" and a second region "1" as shown in FIG. 4. Consequently, a plurality of first regions "0" and a plurality of second regions "1" are marked on the intersection regions of the grille pattern 202G according to the present invention. Furthermore, any first region "0" is adjacent to the second regions "1", and vice versa.

Figure 5:
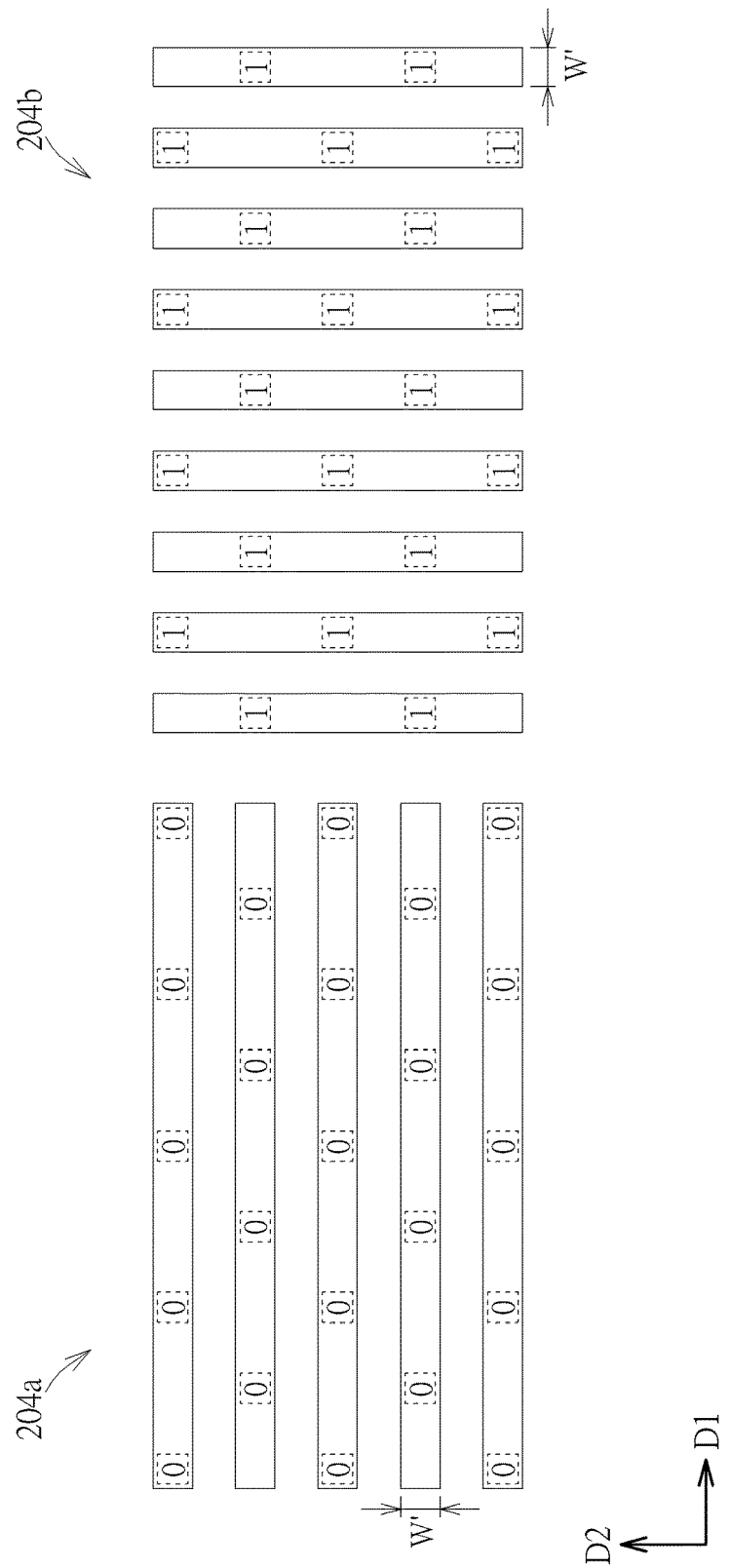

After marking the first regions "0" and the second regions "1", the method for decomposing the semiconductor layout pattern 100 performs following step:

STEP 106b: Performing a second separation/decomposition to the grille pattern to obtain a plurality of first sub-patterns extended along a first direction and a plurality of second sub-patterns extended along a second direction, the first sub-patterns including the first regions, and the second sub-patterns including the second regions Please refer to FIG. 5 together with FIG. 1. Next, the second separation/decomposition is performed to the grille pattern 202G to decompose the grille pattern 202G into a plurality of the first sub-patterns 204a and a plurality of the second sub-patterns 204b. According to the preferred embodiment, a width W' of the first sub-patterns 204a and a width W' of the second sub-patterns 204b can be the same, but not limited to this. The first sub-patterns 204a are extended along the first direction D1 and arranged along the second direction D2. More important, the first sub-patterns 204a include the plurality of first regions "0". The second sub-patterns 204b are extended along the second direction D2 and arranged along the first direction D1. More important, the second sub-patterns 204b include the plurality of the second regions "1". In other words, the first sub-patterns 204a and the second sub-patterns 204b are perpendicular to each other. And the present invention is to assign the first regions "0" to the first sub-patterns 204a and the second regions "1" to the second sub-patterns 204b as shown in FIG. 5.

Figure 6:
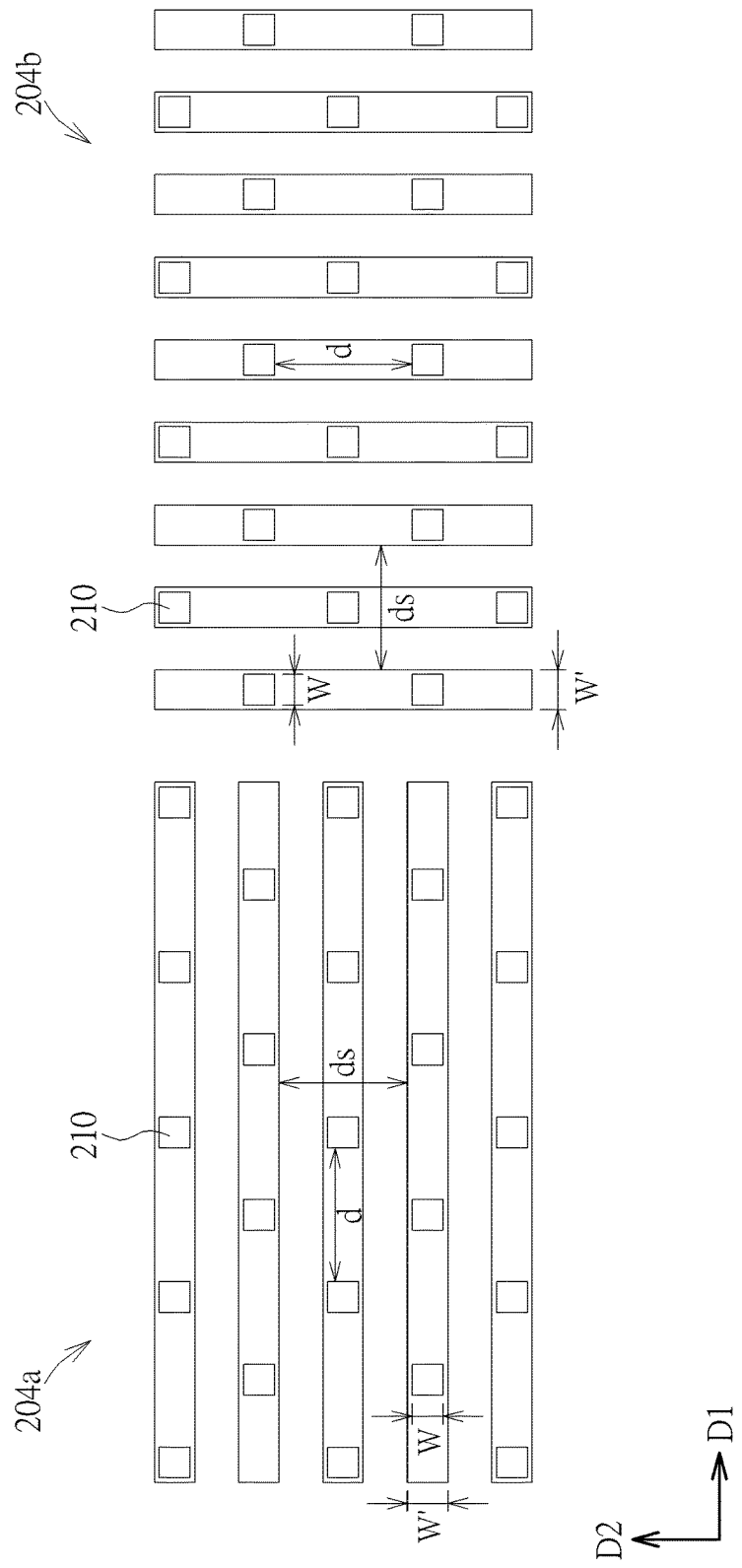

After performing the second separation/decomposition, the method for decomposing the semiconductor layout pattern 100 performs following step:

STEP 106c: Introducing a plurality of assistance features on the first regions in the first sub-patterns and on the second regions in the second sub-patterns, respectively Please refer to FIG. 6 together with FIG. 1. Next, the present invention is to introduce a plurality of assistance features 210 on the first regions "0" in the first sub-patterns 204a and on the second regions "1" in the second sub-patterns 204b, respectively. It is noteworthy that according to the preferred embodiment, the assistance features 210 formed in the first sub-patterns 204a and the second sub-patterns 204b are void features. In other words, a plurality of voids including a same spacing width are formed in the first sub-patterns 204a and the second sub-patterns 204b. It is noteworthy that a width W of the assistance features 210 is smaller than the width W' of the first sub-patterns 204a and the width W' of the second sub-patterns 204b. That is, the assistance features 210 are formed within the first sub-patterns 204a and the second sub-patterns 204b, but not interrupt the first sub-patterns 204a and the second sub-patterns 204b. As shown in FIG. 6, a spacing width "d" between two adjacent assistance features 210 in the first sub-patterns 204a is larger than a sum "$d_s$" of the width W' of one of the second sub-patterns 204b and two spacing widths of two spacings adjacent to that second sub-pattern 204b. In the same concept, a spacing width "d" between two adjacent assistance features 210 in the second sub-patterns 204b is larger than a sum "$d_s$" of the width W' of one of the first sub-patterns 204a and two spacing widths of two spacings adjacent to that first sub-pattern 204a.

Figure 7:
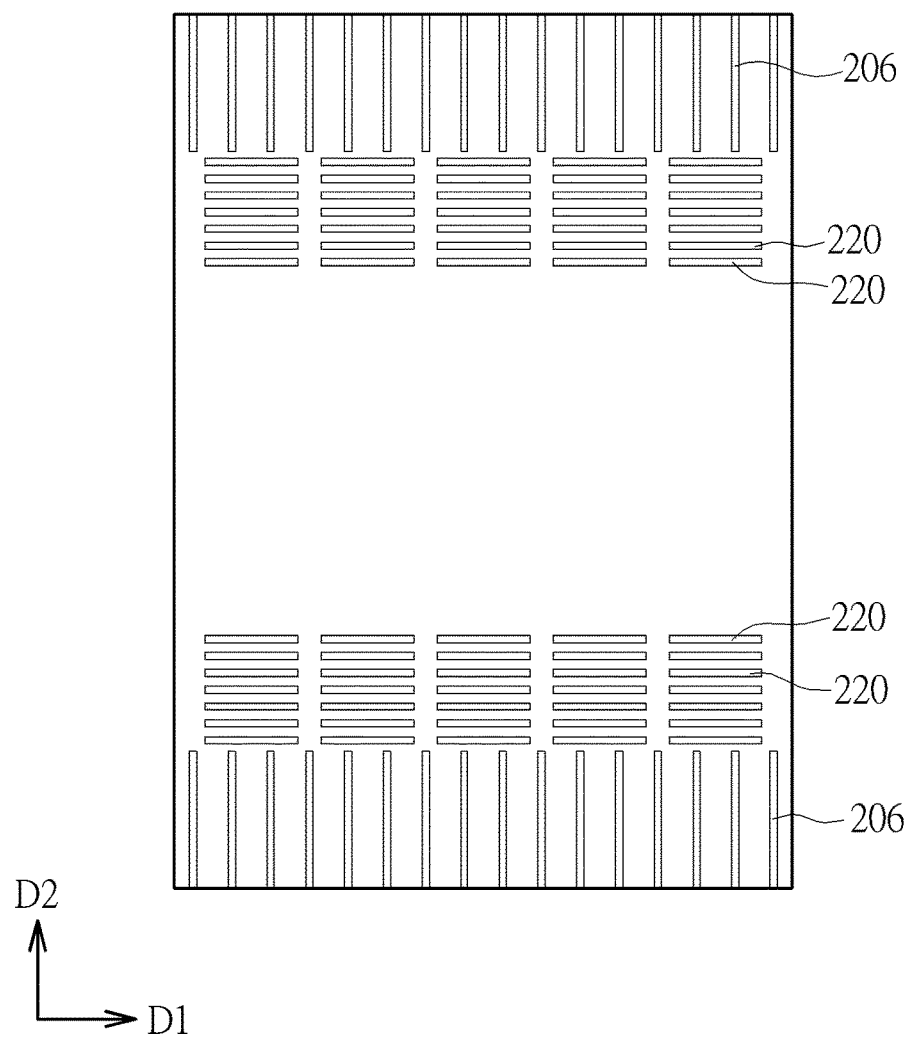

Please refer to FIG. 1 again. Besides performing STEP 106a-STEP 106c to the grille pattern 202G, the present invention includes following steps:

STEP 108: Introducing a plurality of assistance features on the non-grille pattern Please refer to FIGS. 3 and 7. As shown in FIG. 3, the non-grille pattern 202N includes a plurality of third sub-patterns 206 extended along the second direction D2 and arranged along the first direction D1. According to the preferred embodiment, STEP 108 can be performed simultaneously with performing STEP 106a-STEP 106c. Accordingly, a plurality of assistance features 220 are formed in the non-grille pattern 202N, as shown in FIG. 7. It is noteworthy that the assistance features 220 are extended along the first direction D1 and arranged along the second direction D2. In other words, the extending direction of the assistance features 220 is perpendicular to the extending direction of the third sub-patterns 206, and the arrangement direction of the assistance features 220 is perpendicular to the arrangement direction of the third sub-patterns 206. Different from the assistance features 210 that are void features formed in the first sub-patterns 204a and the second sub-patterns 204b, the assistance features 220 formed in the non-grille pattern 202N are solid features.

Additionally, the STEP 102 to STEP 106c and to STEP 108 can be all implemented using a computer. And the method for decomposing the semiconductor layout pattern 100 provided by the present invention further includes following step after STEP 106c and/or STEP 108:

STEP 110: Outputting to photomasks

Figure 8:
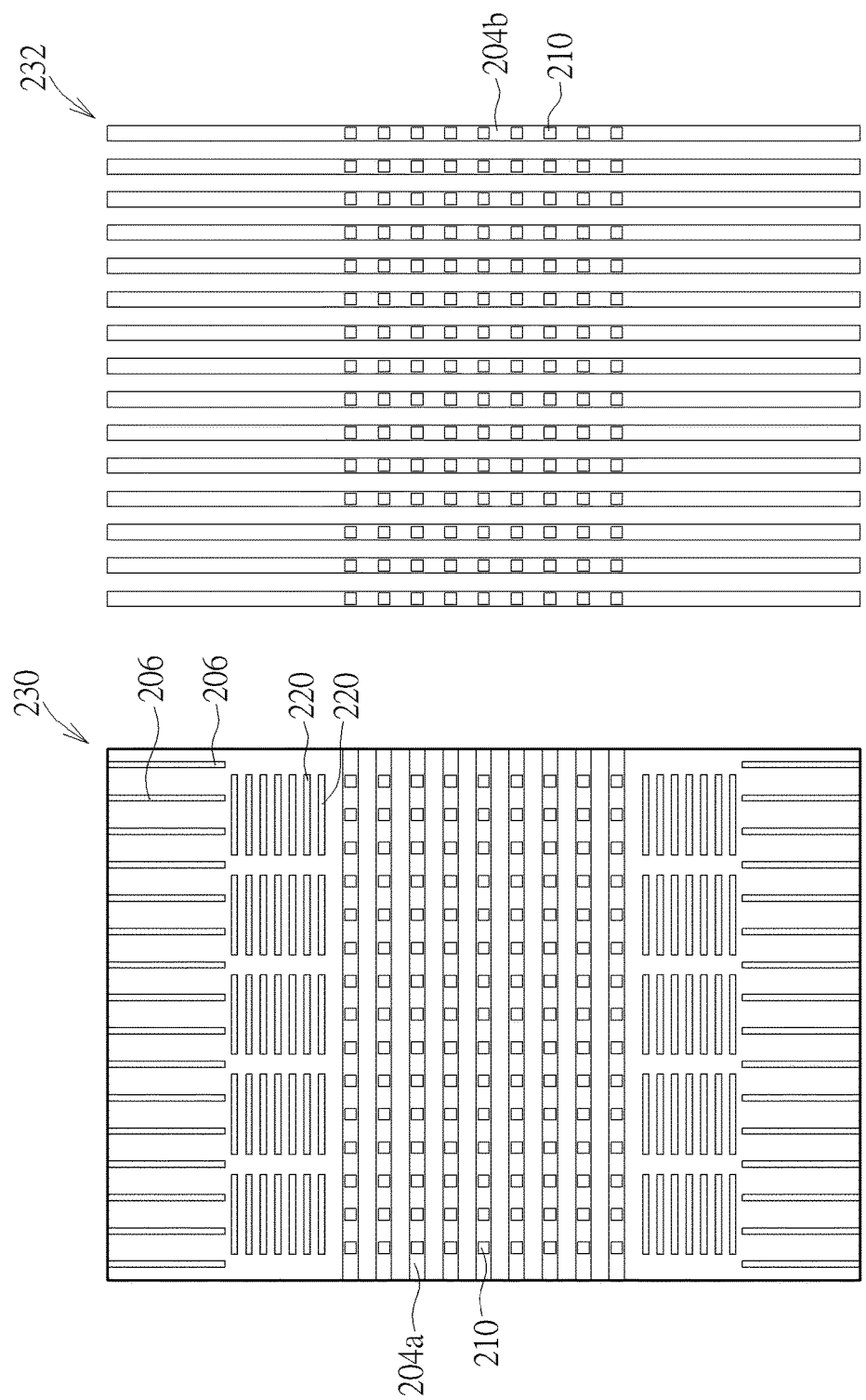
Figure 9:
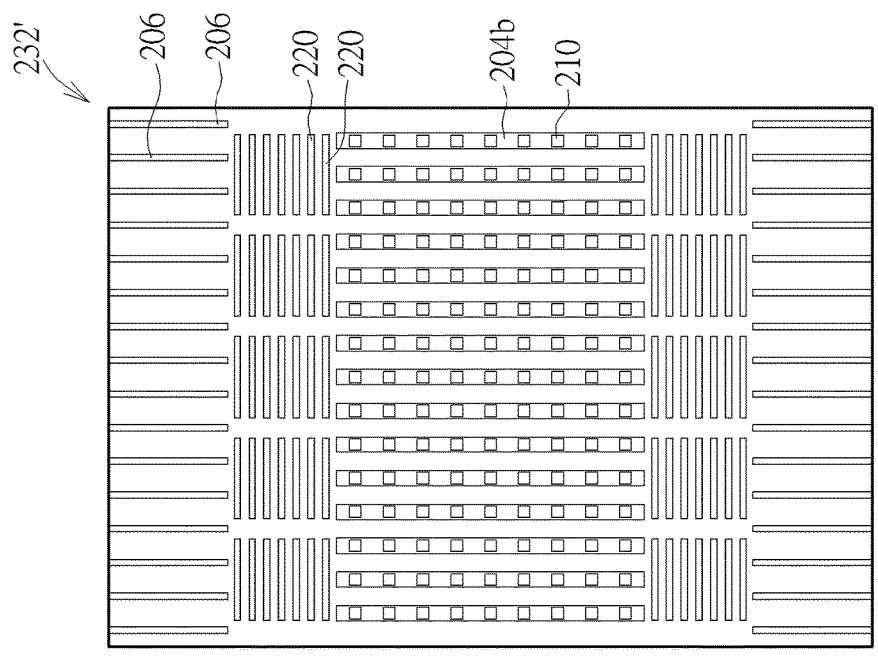
FIG. 9 is a schematic drawing illustrating a modification to the preferred embodiment.
Figure 9:
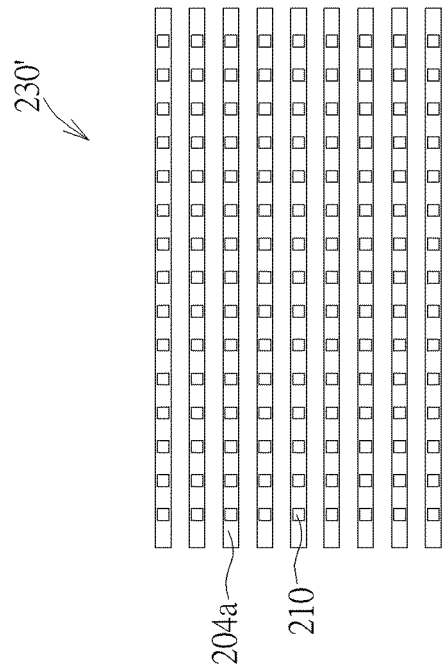

Please refer to FIG. 8. After separating/decomposing the semiconductor layout pattern 200 to the grille pattern 202G and the non-grille pattern 202N, separating/decomposing the grille pattern 202G and introducing the assistance features 210 in the grille pattern 202G, and introducing the assistance features 220 in the non-grille pattern 202N as mentioned above, the first sub-patterns 204a, the assistance features 210, the non-grille pattern 202N (including the third sub-patterns 206), and the assistance features 220 are outputted to a first photomask 230. Simultaneously, the second sub-patterns 204b and the assistance features 210 are outputted to a second photomask 232, as shown in FIG. 8. Please refer to FIG. 9, which is a schematic drawing illustrating a modification to the preferred embodiment. According to the modification, the first sub-patterns 204a and the assistance features 210 are outputted to a first photomask 230'. And the non-grille pattern 202N (including the third sub-patterns 206), the assistance features 220, the second sub-patterns 204b and the assistance features 210 are outputted to a second photomask 232'. It is concluded that the non-grille pattern 202N (including the third sub-patterns 206) and the assistance features 220 can be outputted to a photomask 230 with the first sub-patterns 204a and the assistance features 210, or alternatively to a photomask 232' with the second sub-patterns 204b and the assistance features 210. In addition, in other embodiments of the present invention, STEP 108 can be an optional step. That is, no assistance feature is introduced in the non-grille pattern 202N. Consequently, the first sub-patterns 204a, the assistance features 210, and the third sub-patterns 206 of the non-grille pattern 202N are outputted to a first photomask (not shown) while the second sub-patterns 204b and the assistance features 210 are outputted to a second photomask (not shown).

Figure 10:
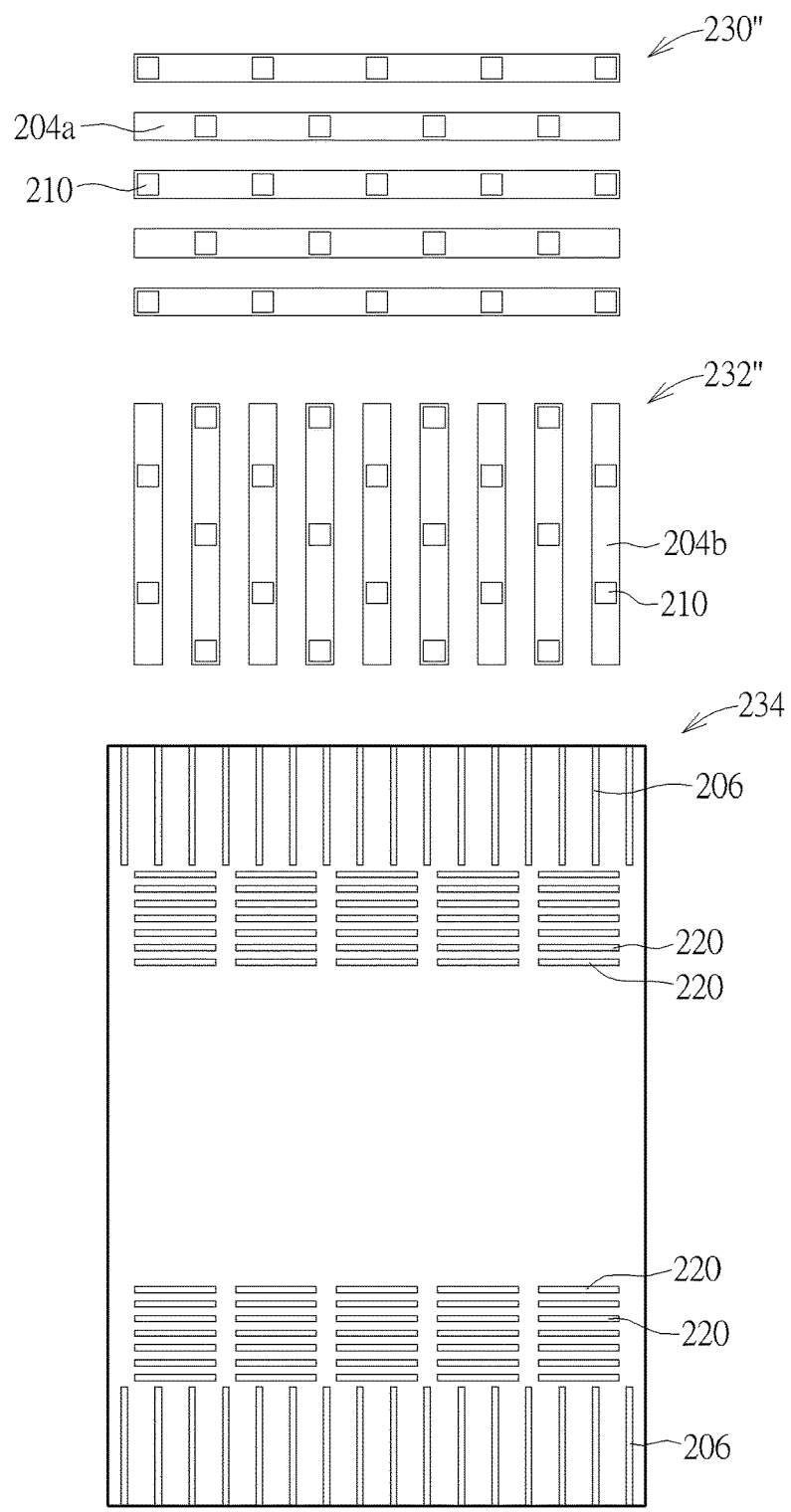
FIG. 10 is a schematic drawing a method for decomposing a semiconductor layout pattern provided by another preferred embodiment of the present invention.

Please refer to FIG. 10, which is a schematic drawing a method for decomposing a semiconductor layout pattern provided by another preferred embodiment of the present invention. It should be noted that the method for decomposing the semiconductor layout pattern provided by the instant embodiment includes steps and elements the same with the abovementioned embodiment, and thus details are omitted in the interest of brevity. The difference between the method provided by the instant preferred embodiment and the abovementioned embodiment is: After separating/decomposing the semiconductor layout pattern 200 to obtain the grille pattern 202G and the non-grille pattern 202N, separating/decomposing the grille pattern 202G and introducing the assistance features 210 in the grille pattern 202G, and introducing the assistance features 220 in the non-grille pattern 202N as mentioned above, the first sub-patterns 204a and the assistance features 210 are outputted to a first photomask 230", the second sub-patterns 204b and the assistance features 210 are outputted to a second photomask 232", and the non-grille pattern 202N (including the third sub-patterns 206) and the assistance features 220 are outputted to a third photomask 234, as shown in FIG. 10.

Figure 11:
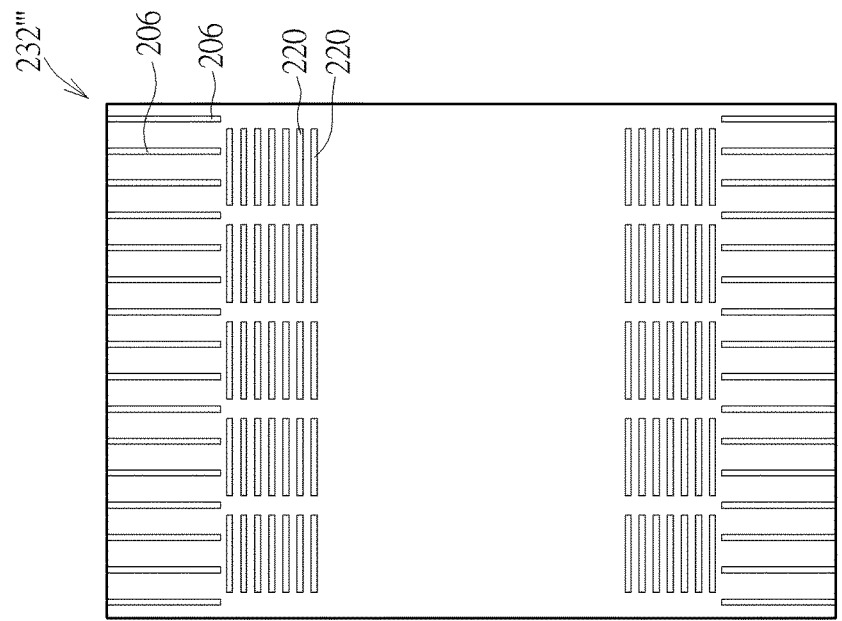
FIG. 11 is a schematic drawing a method for decomposing a semiconductor layout pattern provided by still another preferred embodiment of the present invention.
Figure 11:
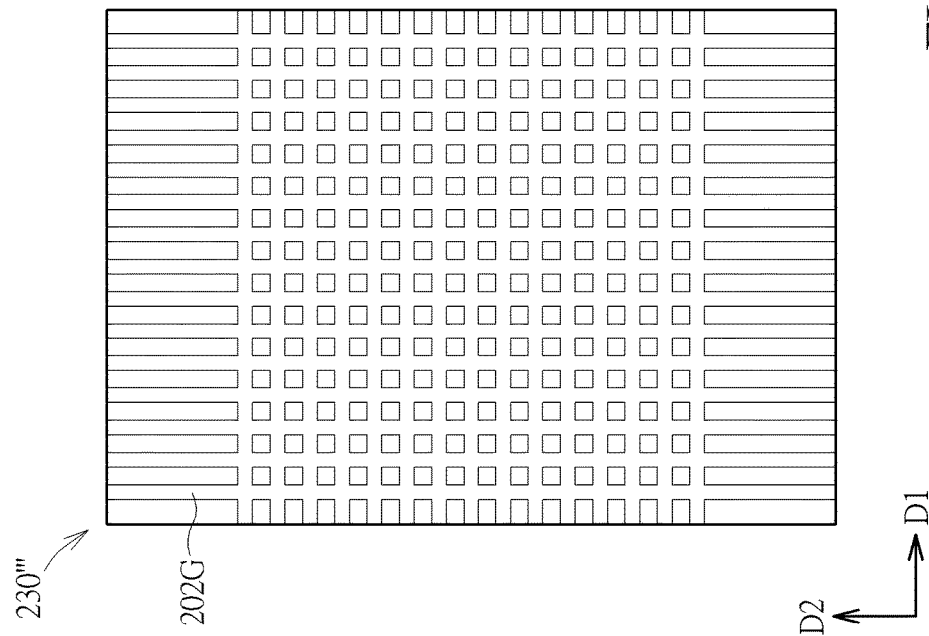

Please refer to FIG. 11, which is a schematic drawing a method for decomposing a semiconductor layout pattern provided by still another preferred embodiment of the present invention. It should be noted that the method for decomposing the semiconductor layout pattern provided by the instant embodiment includes steps and elements the same with the abovementioned embodiment, and thus details are omitted in the interest of brevity. The difference between the method provided by the instant preferred embodiment and the abovementioned embodiment is: STEP 160a-STEP 106c are optional steps according to the instant preferred embodiment. In other words, no separation/decomposition is performed to the grille pattern 202G, and no assistance feature is introduced in the grille pattern 202G. Thereafter, the grille pattern 202G is outputted to a first photomask 230''', and the non-grille pattern 202N (including the third sub-patterns 206) and the assistance features 220 are outputted to a second photomask 232''', as shown in FIG. 11.

Figure 12:
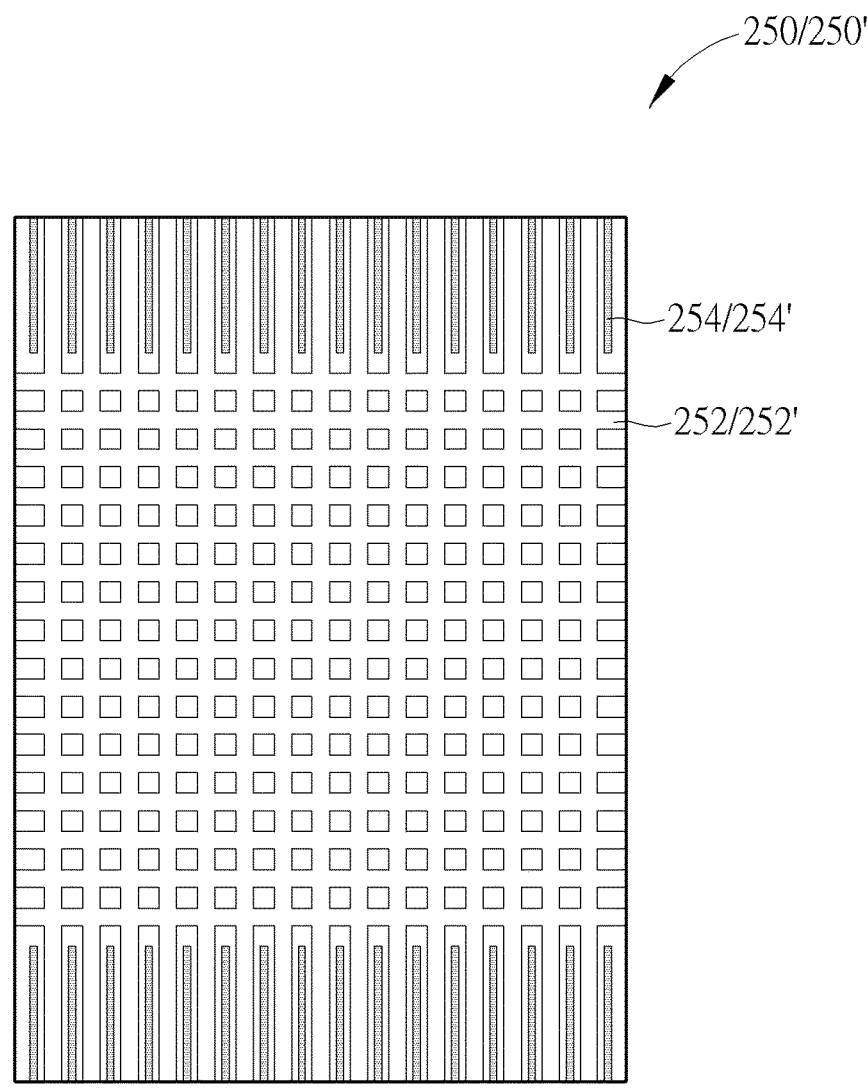
FIG. 12 is a schematic drawing illustrating a semiconductor layout pattern obtained by performing the method provided by the aforementioned embodiments.

Please refer to FIG. 12, which is a schematic drawing illustrating a semiconductor layout pattern obtained by performing the method provided by the aforementioned embodiments. According to the method for decomposing the semiconductor layout pattern provided by the aforementioned preferred embodiments, photomasks are obtained. And the patterns can be transferred from the photomasks to a material layer. In some embodiments of the present invention, the material layer can be a metal layer. A double patterning process, such as litho-etch-litho-etch (2P2E) approach, or litho-litho-etch (2P1E) approach, can be performed according to the preferred embodiments shown in FIGS. 8, 9 or 11. Thus, the first sub-patterns 204a, the assistance features 210, the non-grille pattern 202N (including the third sub-patterns 206) and the assistance features 220 are transferred from the first photomask to the material layer, and the second sub-patterns 204b and the assistance features 210 are transferred from the second photomask to the material layer. Consequently, a patterned material layer 250 is obtained, and the patterned material layer 250 includes the semiconductor layout pattern as shown in FIG. 2. In other embodiments of the present invention, a multiple patterning process can be performed, such that the first sub-patterns 204a and the assistance features 210 are transferred from the first photomask 230" to the material layer, the second sub-patterns 204b and the assistance features 210 are transferred from the second photomask 232" to the material layer, and the non-grille pattern 202N (including the third sub-patterns 206) and the assistance features 220 are transferred from the third photomask 234 to the material layer. Consequently, a patterned material layer 250 is obtained, and the patterned material layer 250 includes the semiconductor layout pattern as shown in FIG. 2. And the patterned material layer 250 includes a grille pattern layer 252 and a plurality of non-grille pattern layer 254.

Please still refer to FIG. 12. In other embodiments of the present invention, the material layer can be a semiconductor layer or a dielectric layer. For example, the double or multiple patterning process can be performed as mentioned above, therefore the patterns and the assistance features are transferred from the photomasks as shown in FIGS. 8-11 to the material layer. Consequently, a patterned material layer 250' including the semiconductor layout pattern as shown in FIG. 2 is obtained. More important, the semiconductor layout pattern of the patterned material layer 250' is a trench pattern. Thereafter, materials such as metal or insulating material can be deposited to fill up the trench pattern and followed by planarization if required. Consequently, a layout pattern that is complementary to the semiconductor layout pattern of the patterned material layer 250' is obtained. In other words, a layout pattern including a grille pattern layer 252' and a plurality of non-grille pattern layers 254' is formed within the patterned material layer 250'. And the grille pattern layer 252' and the non-grille pattern layers 254' include the metal or insulating material.

It is noteworthy that in the double or multiple patterning process, the intersection regions formed by the first sub-patterns 204a and the second sub-patterns 204b are defined as the first/second regions, and the assistance features 210 are void patterns formed on the intersection regions. Therefore, over-etching issue is avoided due to the void patterns formed on the intersection regions. Accordingly, the patterned material layer 250/250' includes the semiconductor layout pattern 200 as expected. It is also noteworthy that though the assistance features 220 formed in the non-grille pattern 202N are solid features, the assistance features 220 are formed avoid line end shortening issue. Therefore the size of the assistance features 220 is reduced to be too tiny to be transferred to the material layer. The assistance features 220 even can be non-printable features. Accordingly, it ensured that the patterned material layer 250/250' includes the semiconductor layout pattern 200 as expected.

According to the methods for decomposing the semiconductor layout pattern provided by the present invention, different assistance features are introduced on the different patterns after the separation/decomposition. Accordingly, by separating the semiconductor layout pattern to the grille pattern and the non-grille pattern, and by introducing different assistance features in the grille pattern and the non-grille pattern, features/patterns formed on any single mask can be successfully and precisely formed by the multiple patterning lithography. Thus, the methods for decomposing the semiconductor layout pattern provided by the present invention improve the multiple patterning lithography result.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for decomposing a semiconductor layout pattern, comprising steps of:
   (a) receiving a semiconductor layout pattern;
   (b) performing a first separation/decomposition to the semiconductor layout pattern to obtain a grille pattern and a non-grille pattern, wherein the grille pattern comprises a plurality of first sub-patterns respectively extending along a first direction and a plurality of second sub-patterns respectively extending along a second direction and intersecting with the first sub-patterns;
   (c) recognizing a plurality of intersection regions of the first sub-patterns and the second sub-patterns and marking the intersection regions respectively as first regions and second regions alternately along the first direction and the second direction;
   (d) performing a second separation/decomposition to decompose the grille pattern into a set of the plurality of first sub-patterns and another set of the plurality of second sub-patterns; and
   (e) introducing a plurality of first assistance features in regions of the first sub-patterns associated with the first regions and in regions of the second sub-patterns associated with the second regions, respectively; and
   (f) outputting the set of the first sub-patterns and the first assistance features in the first sub-patterns to a first photomask, and outputting the set of the second sub-patterns and the first assistance features in the second sub-patterns to a second photomask.

2. The method for decomposing the semiconductor layout pattern according to claim 1, wherein a width of the first assistance features is smaller than a width of the first sub-patterns and a width of the second sub-patterns.

3. The method for the semiconductor layout pattern decomposition according to claim 1, wherein a width of the first sub-patterns is equal to a width of the second sub-patterns.

4. The method for decomposing the semiconductor layout pattern according to claim 1, wherein a spacing width between two adjacent first assistance features in the first sub-patterns is larger than a sum of a width of one of the second sub-patterns and two spacing widths of two spacings adjacent to the second sub-pattern.

5. The method for decomposing the semiconductor layout pattern according to claim 1, wherein a spacing width between two adjacent first assistance features in the second sub-patterns is larger than a sum of a width of one of the first sub-patterns and two spacing widths of two spacings adjacent to the first sub-pattern.

6. The method for decomposing the semiconductor layout pattern according to claim 1, wherein the non-grille pattern comprise a plurality of third sub-patterns, and the third sub-patterns are arranged along the first direction and extended along the second direction.

7. The method for decomposing the semiconductor layout pattern according to claim 6, further comprising a step of introducing a plurality of second assistance features in the non-grille pattern, and the second assistance features being extended along the first direction.

8. The method for decomposing the semiconductor layout pattern according to claim 1, wherein the non-grille pattern is output to the first photomask with the set of the first sub-patterns and the first assistance features in the first sub-patterns.

9. The method for decomposing the semiconductor layout pattern according to claim 8, further comprising a step of transferring the first sub-patterns, the first assistance features and the non-grille pattern from the first photomask, and transferring the second sub-patterns and the first assistance features from the second photomask to a material layer to form a patterned material layer comprising the semiconductor layout pattern.

10. The method for decomposing the semiconductor layout pattern according to claim 1, further comprising a step of outputting the non-grille pattern to a third photomask.

11. The method for decomposing the semiconductor layout pattern according to claim 10, further comprising a step of transferring the first sub-patterns and the first assistance features from the first photomask, transferring the second sub-patterns and the first assistance features from the second photomask, and transferring the non-grille pattern from the third photomask to a material layer to form a patterned material layer comprising the semiconductor layout pattern.

12. A method for decomposing a semiconductor layout pattern, comprising:
(a) receiving a semiconductor layout pattern;
(b) performing a first separation/decomposition to the semiconductor layout pattern to obtain a grille pattern and a non-grille pattern, wherein the non-grille pattern comprise a plurality of third sub-patterns respectively extending along a second direction and being parallelly arranged along a first direction that is perpendicular to the first direction; and
(c) introducing a plurality of first assistance features in the non-grille pattern and adjacent to line ends of the third sub-patterns, wherein the first assistance features respectively extend along the first direction and are parallelly arranged along the second direction; and
(g) outputting the non-grille pattern and the first assistance features to a first photomask.

13. The method for decomposing the semiconductor layout pattern according to claim 12, wherein the grille pattern comprises a plurality of first sub-patterns respectively extending along the first direction and a plurality of second sub-patterns respectively extending along the second direction and intersecting with the first sub-patterns, and the method for decomposing the semiconductor layout pattern further comprises steps of:
(d) recognizing a plurality of intersection regions of the first sub-patterns and the second sub-patterns and marking the intersection regions respectively as first regions and second regions alternately along the first direction and the second direction;
(e) performing a second separation/decomposition to decompose the grille pattern into a set of the plurality of first sub-patterns and another set of the plurality of second sub-patterns; and
(f) introducing a plurality of second assistance features in regions of the first sub-patterns associated with the first regions and in regions of the second sub-patterns associated with the second regions, respectively.

14. The method for decomposing the semiconductor layout pattern according to claim 13, wherein a width of the second assistance features is smaller than a width of the first sub-patterns and a width of the second sub-patterns.

15. The method for decomposing the semiconductor layout pattern according to claim 13, wherein a spacing width between two adjacent second assistance features in the first sub-patterns is larger than a sum of a width of one of the second sub-patterns and two spacing widths of two spacings adjacent to the second sub-pattern.

16. The method for decomposing the semiconductor layout pattern according to claim 13, wherein a spacing width between two adjacent second assistance features in the second sub-patterns is larger than a sum of a width of one of the first sub-patterns and two spacing widths of two spacings adjacent to the first sub-pattern.

17. The method for decomposing the semiconductor layout pattern according to claim 13, wherein the set of the first sub-patterns and the second assistance features in the first sub-patterns are output to the first photomask with the non-grille pattern and the first assistance features, wherein the set of the second sub-patterns and the second assistance features in the second sub-patterns are output to a second photomask .

18. The method for decomposing the semiconductor layout pattern according to claim 13, further comprising a step of outputting the set of the first sub-patterns and the second assistance features in the first sub-patterns to a second photomask and outputting the set of the second sub-patterns and the second assistance features in the second sub-patterns to a third photomask.

19. The method for decomposing the semiconductor layout pattern according to claim 12, wherein the grille pattern is output to a second photomask.

* * * * *